(12) United States Patent
Campbell

(10) Patent No.: US 7,785,976 B2
(45) Date of Patent: Aug. 31, 2010

(54) METHOD OF FORMING A MEMORY DEVICE INCORPORATING A RESISTANCE-VARIABLE CHALCOGENIDE ELEMENT

(75) Inventor: Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/073,055

(22) Filed: Feb. 28, 2008

(65) Prior Publication Data

US 2008/0206920 A1 Aug. 28, 2008

Related U.S. Application Data

(63) Continuation of application No. 10/916,421, filed on Aug. 12, 2004, now Pat. No. 7,354,793.

(51) Int. Cl.
*H01L 45/00* (2006.01)

(52) U.S. Cl. .................. 438/381; 438/95; 257/E45.002

(58) Field of Classification Search .................... 438/95, 438/381; 257/E45.002
See application file for complete search history.

(56) References Cited

U.S. PATENT DOCUMENTS

| | | | |
|---|---|---|---|
| 3,271,591 A | 9/1966 | Ovshinsky | |
| 3,622,319 A | 11/1971 | Sharp | |
| 3,743,847 A | 7/1973 | Boland | |
| 3,961,314 A | 6/1976 | Klose et al. | |
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | |
| 4,312,938 A | 1/1982 | Drexler et al. | |
| 4,316,946 A | 2/1982 | Masters et al. | |
| 4,320,191 A | 3/1982 | Yoshikawa et al. | |
| 4,405,710 A | 9/1983 | Balasubramanyam et al. | |
| 4,419,421 A | 12/1983 | Wichelhaus et al. | |
| 4,499,557 A | 2/1985 | Holmberg et al. | |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |

(Continued)

FOREIGN PATENT DOCUMENTS

JP 56126916 10/1981

(Continued)

OTHER PUBLICATIONS

Abdel-All, A.; Elshafie,A.; Elhawary, M.M., DC electric-field effect in bulk and thin-film Ge5As38Te57 chalcogenide glass, Vacuum 59 (2000) 845-853.

(Continued)

*Primary Examiner*—Marcos D. Pizarro
(74) *Attorney, Agent, or Firm*—Dickstein Shapiro LLP

(57) ABSTRACT

A method of forming a memory device, such as a PCRAM, including selecting a chalcogenide glass backbone material for a resistance variable memory function and devices formed using such a method.

17 Claims, 11 Drawing Sheets

U.S. PATENT DOCUMENTS

| | | | |
|---|---|---|---|
| 4,668,968 A | 5/1987 | Ovshinsky et al. | |
| 4,670,763 A | 6/1987 | Ovshinsky et al. | |
| 4,671,618 A | 6/1987 | Wu et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |
| 4,710,899 A | 12/1987 | Young et al. | |
| 4,728,406 A | 3/1988 | Banerjee et al. | |
| 4,737,379 A | 4/1988 | Hudgens et al. | |
| 4,766,471 A | 8/1988 | Ovshinsky et al. | |
| 4,769,338 A | 9/1988 | Ovshinsky et al. | |
| 4,775,425 A | 10/1988 | Guha et al. | |
| 4,788,594 A | 11/1988 | Ovshinsky et al. | |
| 4,795,657 A | 1/1989 | Formigoni et al. | |
| 4,800,526 A | 1/1989 | Lewis | |
| 4,809,044 A | 2/1989 | Pryor et al. | |
| 4,818,717 A | 4/1989 | Johnson et al. | |
| 4,843,443 A | 6/1989 | Ovshinsky et al. | |
| 4,845,533 A | 7/1989 | Pryor et al. | |
| 4,847,674 A | 7/1989 | Sliwa et al. | |
| 4,853,785 A | 8/1989 | Ovshinsky et al. | |
| 4,891,330 A | 1/1990 | Guha et al. | |
| 5,128,099 A | 7/1992 | Strand et al. | |
| 5,159,661 A | 10/1992 | Ovshinsky et al. | |
| 5,166,758 A | 11/1992 | Ovshinsky et al. | |
| 5,177,567 A | 1/1993 | Klersy et al. | |
| 5,219,788 A | 6/1993 | Abernathey et al. | |
| 5,238,862 A | 8/1993 | Blalock et al. | |
| 5,272,359 A | 12/1993 | Nagasubramanian et al. | |
| 5,296,716 A | 3/1994 | Ovshinsky et al. | |
| 5,314,772 A | 5/1994 | Kozicki | |
| 5,315,131 A | 5/1994 | Kishimoto et al. | |
| 5,335,219 A | 8/1994 | Ovshinsky et al. | |
| 5,341,328 A | 8/1994 | Ovshinsky et al. | |
| 5,350,484 A | 9/1994 | Gardner et al. | |
| 5,359,205 A | 10/1994 | Ovshinsky | |
| 5,360,981 A | 11/1994 | Owen et al. | |
| 5,406,509 A | 4/1995 | Ovshinsky et al. | |
| 5,414,271 A | 5/1995 | Ovshinsky et al. | |
| 5,500,532 A | 3/1996 | Kozicki et al. | |
| 5,512,328 A | 4/1996 | Yoshimura et al. | |
| 5,512,773 A | 4/1996 | Wolf et al. | |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,591,501 A | 1/1997 | Ovshinsky et al. | |
| 5,596,522 A | 1/1997 | Ovshinsky et al. | |
| 5,687,112 A | 11/1997 | Ovshinsky | |
| 5,694,054 A | 12/1997 | Ovshinsky et al. | |
| 5,714,768 A | 2/1998 | Ovshinsky et al. | |
| 5,726,083 A | 3/1998 | Takaishi | |
| 5,751,012 A | 5/1998 | Wolstenholme et al. | |
| 5,761,115 A | 6/1998 | Kozicki et al. | |
| 5,789,277 A | 8/1998 | Zahorik et al. | |
| 5,814,527 A | 9/1998 | Wolstenholme et al. | |
| 5,818,749 A | 10/1998 | Harshfield | |
| 5,825,046 A | 10/1998 | Czubatyj et al. | |
| 5,841,150 A | 11/1998 | Gonzalez et al. | |
| 5,846,889 A | 12/1998 | Harbison et al. | |
| 5,851,882 A | 12/1998 | Harshfield | |
| 5,869,843 A | 2/1999 | Harshfield | |
| 5,896,312 A | 4/1999 | Kozicki et al. | |
| 5,912,839 A | 6/1999 | Ovshinsky et al. | |
| 5,914,893 A | 6/1999 | Kozicki et al. | |
| 5,920,788 A | 7/1999 | Reinberg | |
| 5,933,365 A | 8/1999 | Klersy et al. | |
| 5,998,066 A | 12/1999 | Block et al. | |
| 6,011,757 A | 1/2000 | Ovshinsky | |
| 6,031,287 A | 2/2000 | Harshfield | |
| 6,072,716 A | 6/2000 | Jacobson et al. | |
| 6,077,729 A | 6/2000 | Harshfield | |
| 6,084,796 A | 7/2000 | Kozicki et al. | |
| 6,087,674 A | 7/2000 | Ovshinsky et al. | |
| 6,117,720 A | 9/2000 | Harshfield | |
| 6,141,241 A | 10/2000 | Ovshinsky et al. | |
| 6,143,604 A | 11/2000 | Chiang et al. | |
| 6,177,338 B1 | 1/2001 | Liaw et al. | |
| 6,236,059 B1 | 5/2001 | Wolstenholme et al. | |
| RE37,259 E | 7/2001 | Ovshinsky | |
| 6,297,170 B1 | 10/2001 | Gabriel et al. | |
| 6,300,684 B1 | 10/2001 | Gonzalez et al. | |
| 6,316,784 B1 | 11/2001 | Zahorik et al. | |
| 6,329,606 B1 | 12/2001 | Freyman et al. | |
| 6,339,544 B1 | 1/2002 | Chiang et al. | |
| 6,348,365 B1 | 2/2002 | Moore et al. | |
| 6,350,679 B1 | 2/2002 | McDaniel et al. | |
| 6,376,284 B1 | 4/2002 | Gonzalez et al. | |
| 6,388,324 B2 | 5/2002 | Kozicki et al. | |
| 6,391,688 B1 | 5/2002 | Gonzalez et al. | |
| 6,404,665 B1 | 6/2002 | Lowery et al. | |
| 6,414,376 B1 | 7/2002 | Thakur et al. | |
| 6,418,049 B1 | 7/2002 | Kozicki et al. | |
| 6,420,725 B1 | 7/2002 | Harshfield | |
| 6,423,628 B1 | 7/2002 | Li et al. | |
| 6,429,064 B1 | 8/2002 | Wicker | |
| 6,437,383 B1 | 8/2002 | Xu | |
| 6,440,837 B1 | 8/2002 | Harshfield | |
| 6,462,984 B1 | 10/2002 | Xu et al. | |
| 6,469,364 B1 | 10/2002 | Kozicki | |
| 6,473,332 B1 | 10/2002 | Ignatiev et al. | |
| 6,480,438 B1 | 11/2002 | Park | |
| 6,487,106 B1 | 11/2002 | Kozicki | |
| 6,487,113 B1 | 11/2002 | Park et al. | |
| 6,501,111 B1 | 12/2002 | Lowery | |
| 6,507,061 B1 | 1/2003 | Hudgens et al. | |
| 6,511,862 B2 | 1/2003 | Hudgens et al. | |
| 6,511,867 B2 | 1/2003 | Lowery et al. | |
| 6,512,241 B1 | 1/2003 | Lai | |
| 6,514,805 B2 | 2/2003 | Xu et al. | |
| 6,531,373 B2 | 3/2003 | Gill et al. | |
| 6,534,781 B2 | 3/2003 | Dennison | |
| 6,545,287 B2 | 4/2003 | Chiang | |
| 6,545,907 B1 | 4/2003 | Lowery et al. | |
| 6,555,860 B2 | 4/2003 | Lowery et al. | |
| 6,563,164 B2 | 5/2003 | Lowery et al. | |
| 6,566,700 B2 | 5/2003 | Xu | |
| 6,567,293 B1 | 5/2003 | Lowery et al. | |
| 6,569,705 B2 | 5/2003 | Chiang et al. | |
| 6,570,784 B2 | 5/2003 | Lowery | |
| 6,576,921 B2 | 6/2003 | Lowery | |
| 6,586,761 B2 | 7/2003 | Lowery | |
| 6,589,714 B2 | 7/2003 | Maimon et al. | |
| 6,590,807 B2 | 7/2003 | Lowery | |
| 6,593,176 B2 | 7/2003 | Dennison | |
| 6,597,009 B2 | 7/2003 | Wicker | |
| 6,605,527 B2 | 8/2003 | Dennison et al. | |
| 6,613,604 B2 | 9/2003 | Maimon et al. | |
| 6,621,095 B2 | 9/2003 | Chiang et al. | |
| 6,625,054 B2 | 9/2003 | Lowery et al. | |
| 6,635,914 B2 * | 10/2003 | Kozicki et al. | 257/296 |
| 6,642,102 B2 | 11/2003 | Xu | |
| 6,646,297 B2 | 11/2003 | Dennison | |
| 6,649,928 B2 | 11/2003 | Dennison | |
| 6,667,900 B2 | 12/2003 | Lowery et al. | |
| 6,671,710 B2 | 12/2003 | Ovshinsky et al. | |
| 6,673,648 B2 | 1/2004 | Lowrey | |
| 6,673,700 B2 | 1/2004 | Dennison et al. | |
| 6,674,115 B2 | 1/2004 | Hudgens et al. | |
| 6,687,153 B2 | 2/2004 | Lowery | |
| 6,687,427 B2 | 2/2004 | Ramalingam et al. | |
| 6,690,026 B2 | 2/2004 | Peterson | |
| 6,696,355 B2 | 2/2004 | Dennison | |

| | | |
|---|---|---|
| 6,707,712 B2 | 3/2004 | Lowery |
| 6,714,954 B2 | 3/2004 | Ovshinsky et al. |
| 7,402,851 B2 * | 7/2008 | Hideki et al. ............... 257/246 |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous memories and bistable switches, J. Vac. Sci. Technol. 9 (1972) 1182-1189.
Adler, D.; Henisch, H.K.; Mott, S.N., The mechanism of threshold switching in amorphous alloys, Rev. Mod. Phys. 50 (1978) 209-220.
Afifi, M.A.; Labib, H.H.; El-Fazary, M.H.; Fadel, M., Electrical and thermal properties of chalcogenide glass system Se75Ge25-xSbx, Appl. Phys. A 55 (1992) 167-169.
Afifi,M.A.; Labib, H.H.; Fouad, S.S.; El-Shazly, A.A:, Electrical & thermal conductivity of the amorphous semiconductor GexSe1-x, Egypt, J. Phys. 17 (1986) 335-342.
Alekperova, Sh.M.; Gadzhieva, G.S., Current-voltage characteristics of Ag2Se single crystal near the phase transition, Inorganic Materials 23 (1987) 137-139.
Aleksiejunas, A.; Cesnys, A., Switching phenomenon and memory effect in thin-film heterojunction of polycrystalline selenium-silver selenide, Phys. Stat. Sol. (a) 19 (1973) K169-K171.
Angell, C.A., Mobile ions in amorphous solids, Annu. Rev. Phys. Chem. 43 (1992) 693-717.
Aniya, M., Average electronegativity, medium-range-order, and ionic conductivity in superionic glasses, Solid state Ionics 136-137 (2000) 1085-1089.
Asahara, Y.; Izumitani, T., Voltage controlled switching in Cu-As-Se compositions, J. Non-Cryst. Solids 11 (1972) 97-104.
Asokan, S.; Prasad, M.V.N.; Parthasarathy, G.; Gopal, E.S.R., Mechanical and chemical thresholds in IV-VI chalcogenide glasses, Phys. Rev. Lett. 62 (1989) 808-810.
Axon Technologies Corporation, Technology Description: *Programmable Metalization Cell(PMC)*, pp. 1-6 (Pre-May 2000).
Baranovskii, S.D.; Cordes, H., On the conduction mechanism in ionic glasses, J. Chem. Phys. 111 (1999) 7546-7557.
Belin, R.; Taillades, G.; Pradel, A.; Ribes, M., Ion dynamics in superionic chalcogenide glasses: complete conductivity spectra, Solid State Ionics 136-137 (2000) 1025-1029.
Belin, R.; Zerouale, A.; Pradel, A.; Ribes, M., Ion dynamics in the argyrodite compound Ag7GeSe5I: non-Arrhenius behavior and complete conductivity spectra, Solid State Ionics 143 (2001) 445-455.
Benmore, C.J.; Salmon, P.S., Structure of fast ion conducting and semiconducting glassy chalcogenide alloys, Phys. Rev. Lett. 73 (1994) 264-267.
Bernede, J.C., Influence du metal des electrodes sur les caracteristiques courant-tension des structures M-Ag2Se-M, Thin solid films 70 (1980) L1-L4.
Bernede, J.C., Polarized memory switching in MIS thin films, Thin Solid Films 81 (1981) 155-160.
Bernede, J.C., Switching and silver movements in Ag2Se thin films, Phys. Stat. Sol. (a) 57 (1980) K101-K104.
Bernede, J.C.; Abachi, T., Differential negative resistance in metal/insulator/metal structures with an upper bilayer electrode, Thin Solid Films 131 (1985) L61-L64.
Bernede, J.C.; Conan, A.; Fousenan't, E.; El Bouchairi, B.; Goureaux, G., Polarized memory switching effects in Ag2Se/Se/M thin film sandwiches, Thin Solid Films 97 (1982) 165-171.
Bernede, J.C.; Khelil, A.; Kettaf, M.; Conan, A., Transition from S- to N-type differential negative resistance in Al-Al2O3-Ag2-xSe1+x thin film structures, Phys. Stat. Sol. (a) 74 (1982) 217-224.
Bondarev, V.N.; Pikhitsa, P.V., A dendrite model of current instability in RbAg4I5, Solid State Ionics 70/71 (1994) 72-76.
Boolchand, P., The maximum in glass transition temperature (Tg) near x=1/3 in GexSe1-x Glasses, Asian Journal of Physics (2000) 9, 709-72.
Boolchand, P.; Bresser, W.J., Mobile silver ions and glass formation in solid electrolytes, Nature 410 (2001) 1070-1073.
Boolchand, P.; Georgiev, D.G.; Goodman, B., Discovery of the Intermediate Phase in Chalcogenide Glasses, J. Optoelectronics and Advanced Materials, 3 (2001), 703.
Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.
Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.
Boolchand, P.; Grothaus, J.; Bresser, W.J.; Suranyi, P., Structural origin of broken chemical order in a GeSe2 glass, Phys. Rev. B 25 (1982) 2975-2978.
Boolchand, P.; Grothaus, J.; Phillips, J.C., Broken chemical order and phase separation in GexSe1-x glasses, Solid State Comm. 45 (1983) 183-185.
Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.
Boolchand, P.; Grothaus, J, Molecular Structure of Melt-Quenched GeSe2 and GeS2 glasses compared, Proc. Int. Conf. Phys. Semicond. (Eds. Chadi and Harrison) 17th (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L., Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Dryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2° to 300° K, J. Appl. Phys. 38 (1967) 753-756.

Davis, E.A., Semiconductors without form, Search 1 (1970) 152-155.

Dearnaley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of Ag2-xSe1+x/n-Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992) 259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel, M.; El-Shair, H.T., Electrical, thermal and optical properties of Se75Ge7Sb18, Vacuum 43 (1992) 253-257.

Feng, X. Bresser, W.J.; Boolchand, P., Direct evidence for stiffness threshold in chalcogenide glasses, Phys. Rev. Lett. 78 (1997) 4422-4425.

Feng, X. Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag-GeSe2 thin films, Phys. Rev. B 38 (1988) 12388-12403.

Fleury, G.; Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C; Melscoet, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Helbert et al., *Intralevel hybrid resist process with submicron capability*, SPIE vol. 333 Submicron Lithography, pp. 24-29 (1982).

Hilt, Dissertation: *Materials Characterization of Silver Chalcogenide Programmable Metalization Cells*, Arizona State University, pp. Title page-114 (UMI Company, May 1999).

Hirose et al., *High Speed Memory Behavior and Reliability of an Amorphous $As_2S_3$ Film Doped with Ag*, Phys. Stat. Sol. (a) 61, pp. 87-90 (1980).

Hirose, Y.; Hirose, H., Polarity-dependent memory switching and behavior of Ag dendrite in Ag-photodoped amorphous As2S3 films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/p+a-Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Huggett et al., Development of silver sensitized germanium selenide photoresist by reactive sputter etching in SF6, 42 Appl. Phys. Lett., No. 7, pp. 592-594 (Apr. 1983).

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-441.

Kaplan, T.; Adler, D., Electrothermal switching in amorphous semiconductors, J. Non-Cryst. Solids 8-10 (1972) 538-543.

Kawaguchi et al., *Mechanism of photosurface deposition*, 164-166 J. Non-Cryst. Solids, pp. 1231-1234 (1993).

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawamoto, Y., Nishida, M., Ionic Condition in As2S3—Ag2S, GeS2—GeS—Ag2S and P2S5-Ag2S Glasses, J. Non-Cryst Solids 20 (1976) 393-404.

Kawasaki, M.; Kawamura, J.; Nakamura, Y.; Aniya, M., Ionic conductivity of Agx(GeSe3)1-x (0<=x<=0.571) glasses, Solid State Ionics 123 (1999) 259-269.

Kluge, G.; Thomas, A.; Klabes, R.; Grotzschel, R., Suptitz, P. Silver photodiffusion in amorphous GexSe100-x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Kolobov et al., Photodoping of amorphous chalcogenides by metals, Advances in Physics, 1991, vol. 40, No. 5, pp. 625-684.

Korkinova, Ts.N.; Andreichin, R.E., Chalcogenide glass polarization and the type of contacts, J. Non-Cryst. Solids 194 (1996) 256-259.

Kotkata, M.F.; Afifi M.A.; Labib, H.H.; Hegab, N.A.; Abdel-Aziz, M.M., Memory switching in amorphous GeSeTl chalcogenide semiconductor films, Thin Solid Films 240 (1994) 143-146.

Kozicki et al., Silver incorporation in thin films of selenium rich Ge-Se glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes in Metal-Doped Chalcogenides, Electrochemical Society Proceedings, vol. 99-13, 1999, pp. 298-309.

Kozicki et al., Nanoscale effects in devices based on chalcogenide solid solutions, Superlattices and Microstructures, vol. 27, No. 5/6, 2000, pp. 485-488.

Kozicki et al., Nanoscale phase separation in Ag-Ge-Se glasses, Microelectronic Engineering 63 (2002) pp. 155-159.

Lakshminarayan, K.N.; Srivastava, K.K.; Panwar, O.S.; Kumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of Pure & Appl. Phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on Se-SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2-V2O5 based glasses, Journal de Physique IV 2 (1992) C2-185—C2-188.

McHardy et al., The dissolution of metals in amorphous chalcogenides and the effects of electron and ultraviolet radiation, 20 J. Phys. C.: Solid State Phys., pp. 4055-4075 (1987).

Messoussi, R.; Bernede, J.C.; Benhida, S.; Abachi, T.; Latef, A., Electrical characterization of M/Se structures (M=Ni,Bi), Mat. Chem. and Phys. 28 (1991) 253-258.

Mitkova, M.; Boolchand, P., Microscopic origin of the glass forming tendency in chalcohalides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett. 83 (1999) 3848-3852.

Miyatani, S.-y., Electronic and ionic conduction in (AgxCu1-x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transition in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical properties of GexSe1-x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Metalurgical Transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-State Electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical switching in germanium telluride glasses doped with Cu and Ag, Appl. Phys. A 69 (1999) 421-425.

Rose,M.J.;Hajto,J.;Lecomber,P.G.;Gage,S.M.;Choi,W.K.;Snell,A.J.; Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A.G.; Owen,A.E., Aspects of non-volatility in a -Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, R. P., Structural, electrical and optical properties of silver selenide films, Ind. J. of Pure and Applied Phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3665 (1973).

Snell, A.J.; Lecomber, P.G.; Hajto, J.; Rose, M.J.; Owen, A.E.; Osborne, I.S., Analogue memory effects in metal/a-Si:H/metal memory devices, J. Non-Cryst. Solids 137-138 (1991) 1257-1262.

Snell, A.J.; Hajto, J.;Rose, M.J.; Osborne, I.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effect on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal(??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant,S.;Peytavin,S.;Ribes,M.;Flank,A.M.;Dexpert,H.; Lagarde,J.P., Silver chalcogenide glasses Ag-Ge-Se: Ionic conduction and exafs structural investigation, Transport-structure relations in fast ion and mixed conductors Proceedings of the 6th Riso International Symposium. Sep. 9-13, 1985, pp. 425-430.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1996) 267-272.

Vodenicharov, C.; Parvanov,S.; Petkov,P., Electrode-limited currents in the thin-film M-GeSe-M system, Mat. Chem. and Phys. 21 (1989) 447-454.

Wang, S.-J.; Misium, G.R.; Camp, J.C.; Chen, K.-L.; Tigelaar, H.L., High-performance Metal/silicide antifuse, IEEE Electron Dev. Lett. 13 (1992) 471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998, 189 pages.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

* cited by examiner

METHOD OF FORMING A MEMORY DEVICE INCORPORATING A RESISTANCE-VARIABLE CHALCOGENIDE ELEMENT

This application is a continuation of U.S. patent application Ser. No. 10/916,421, filed Aug. 12, 2004 now U.S. Pat. No. 7,354,793, the entity of which has been incorporated by reference.

FIELD OF THE INVENTION

The invention relates to the field of random access memory (RAM) devices formed using a resistance variable material.

BACKGROUND

Resistance variable memory elements, which include Programmable Conductive Random Access Memory (PCRAM) elements, have been investigated for suitability as semi-volatile and non-volatile random access memory devices. In a typical PCRAM device, the resistance of a chalcogenide glass backbone can be programmed to stable lower conductivity (i.e., higher resistance) and higher conductivity (i.e., lower resistance) states. An unprogrammed PCRAM device is normally in a lower conductivity, higher resistance state.

A conditioning operation forms a conducting channel of a metal-chalcogenide in the PCRAM device, which supports a conductive pathway for altering the conductivity/resistivity state of the device. The conducting channel remains in the glass backbone even after the device is erased. After the conditioning operation, a write operation will program the PCRAM device to a higher conductivity state, in which metal ions accumulate along the conducting channel(s). The PCRAM device may be read by applying a voltage of a lesser magnitude than required to program it; the current or resistance across the memory device is sensed as higher or lower to define the logic "one" and "zero" states. The PCRAM may be erased by applying a reverse voltage (opposite bias) relative to the write voltage, which disrupts the conductive pathway, but typically leaves the conducting channel intact. In this way, such a device can function as a variable resistance memory having at least two conductivity states, which can define two respective logic states, i.e., at least a bit of data.

One exemplary PCRAM device uses a germanium selenide (i.e., $Ge_xSe_{100-x}$) chalcogenide glass as a backbone. The germanium selenide glass has, in the prior art, incorporated silver (Ag) by (photo or thermal) doping or co-deposition. Other exemplary PCRAM devices have done away with such doping or co-deposition by incorporating a metal-chalcogenide material as a layer of silver selenide (e.g., $Ag_2Se$), silver sulfide (AgS), or tin selenide (SnSe) in combination with a metal layer, proximate a chalcogenide glass layer, which during conditioning of the PCRAM provides material to form a conducting channel and a conductive pathway in the glass backbone.

Extensive research has been conducted to determine suitable materials and stoichiometries thereof for the glass backbone in PCRAM devices. Germanium selenide having a stoichiometry of about $Ge_{40}Se_{60}$, as opposed to $Ge_{23}Se_{77}$ or $Ge_{30}Se_{70}$, for example, has been found to function well for this purpose. A glass backbone of $Ge_{40}Se_{60}$, with an accompanying metal-chalcogenide (e.g., typically silver selenide) layer, enables a conducting channel to be formed in the glass backbone during conditioning, which can thereafter be programmed to form a conductive pathway. The metal-chalcogenide is incorporated into chalcogenide glass layer at the conditioning step. Specifically, the conditioning step comprises applying a potential (about 0.20 V) across the memory element structure of the device such that metal-chalcogenide material is incorporated into the chalcogenide glass layer, thereby forming a conducting channel within the chalcogenide glass layer. It is theorized that $Ag_2Se$ is incorporated onto the glass backbone at Ge—Ge sites via new Ge—Se bonds, which allows silver (Ag) migration into and out of the conducting channel during programming. Movement of metal (e.g., typically silver) ions into or out of the conducting channel during subsequent programming and erasing forms or dissolves a conductive pathway along the conducting channel, which causes a detectable conductivity (or resistance) change across the memory device.

It has been determined that $Ge_{40}Se_{60}$ works well as the glass backbone in a PCRAM device because this stoichiometry makes for a glass that is rigid and incorporates thermodynamically unstable germanium-germanium (Ge—Ge) bonds. The presence of another species, such as silver selenide provided from an accompanying layer, can, in the presence of an applied potential, break the Ge—Ge bonds and bond with the previously homopolar bonded Ge to form conducting channels. These characteristics make this "40/60" stoichiometry optimal when using a germanium selenide chalcogenide glass with respect to the formation of a conducting channel and conductive pathway.

While germanium-chalcogenide (e.g., $Ge_{40}Se_{60}$) glass layers are highly desirable for PCRAM devices, other glasses may be desirable to improve switching properties or thermal limitations of the devices.

SUMMARY

The invention provides embodiments of a method of determining suitable glass backbone material, which may be used in place of $Ge_{40}Se_{60}$ glass in a resistance variable memory device, such as a PCRAM, with other materials, a method of forming memory devices with such materials, and devices constructed in accordance with these methods.

The chalcogenide glass material may be represented by $A_xB_{100-x}$, where A is a non-chalcogenide material selected from Groups 3-15 of the periodic table and B is a chalcogenide material from Group 16. The method of selecting a glass material includes: (1) selection of a non-chalcogenide component A from Groups 3-15 that will exhibit homopolar bonds; (2) selection of a chalcogenide component B from Group 16 for which component A will have a bonding affinity, relative to the A-A homopolar bonds; (3) selection of a stoichiometry (i.e., x of $A_xB_{100-x}$) that will allow the homopolar A-A bonds to form; and (4) confirmation that the glass $A_xB_{100-x}$, at the selected stoichiometry (i.e., x), will allow a conducting channel and a conductive pathway to form therein upon application of a conditioning voltage (when a metal-chalcogenide layer and metal ions are proximate the glass).

An exemplary memory device constructed in accordance with an embodiment of the invention uses an arsenic selenide glass backbone having a $As_{50}Se_{50}$ stoichiometry and a metal-chalcogenide layer proximate thereto for a memory cell. Other layers may also be associated with this glass backbone and metal-chalcogenide layer.

The above and other features and advantages of the invention will be better understood from the following detailed description, which is provided in connection with the accompanying drawings.

DETAILED DESCRIPTION

Figure 1:
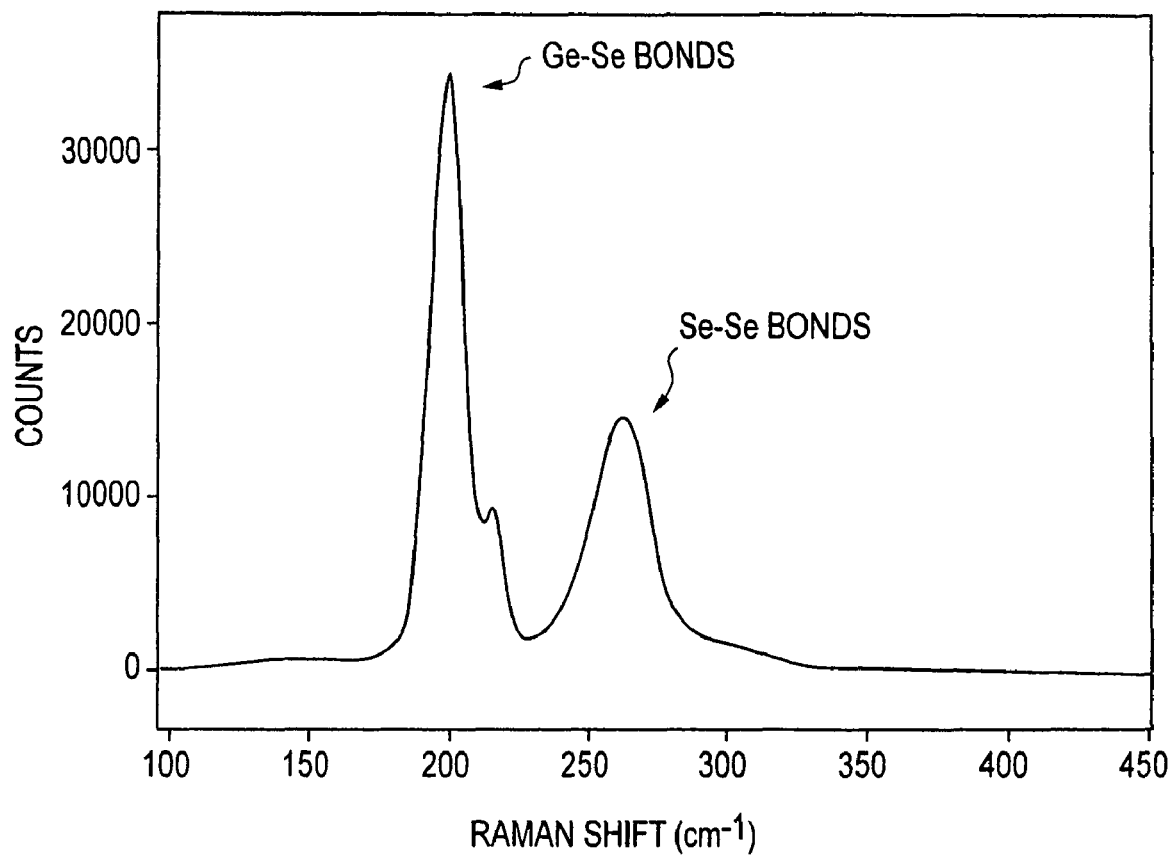
FIGS. 1-3 show graphs of Raman shift analysis of germanium selenide glass, which may be used in selecting glass backbone materials in accordance with the invention.

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but may be any support structure suitable for supporting an integrated circuit, including, but not limited to, metals, alloys, glasses, polymers, ceramics, and any other supportive materials as is known in the art.

The term "chalcogenide" is intended to include various alloys, compounds, and mixtures of chalcogens (elements from Group 16 of the periodic table, e.g., sulfur (S), selenium (Se), tellurium (Te), polonium (Po), and oxygen (O)).

Embodiments of the invention provide a method of selecting a glass backbone material for use in a resistance variable memory device, such as a PCRAM. The backbone material (i.e., backbone glass layer 18 of FIGS. 4 and 5) may be represented by the formula $A_xB_{100-x}$, where A is a non-chalcogenide material selected from Groups 3-15, and preferably 13, 14, and 15, of the periodic table and B is a chalcogenide material. The glass backbone may also be represented by the formula $(A_xB_{100-x})C_y$, where C represents one or more additional components, which may be present in some glass formulations, but which may be omitted; therefore, the description hereafter will focus on two components (A and B) for simplicity sake. The ultimate choice for the material $A_xB_{100-x}$ depends, in part, on the make up of an adjacent metal-chalcogenide layer (e.g., layer 20 of FIGS. 4 and 5) with which it operationally engages. The component A should have an affinity for the chalcogenide component B, and preferably for the chalcogenide material (which is preferably also component B) of the metal-chalcogenide layer. Since $Ge_{40}Se_{60}$ glass has been observed to have good glass backbone properties in PCRAM devices, a backbone material represented by the formula $A_xB_{100-x}$ should have properties similar to $Ge_{40}Se_{60}$ glass, such as homopolar bond properties and affinity of the Ge for the chalcogenide component in the metal-chalcogenide layer.

Taking these characteristics into consideration, a primary consideration in selecting components A and B and the stoichiometry for a glass backbone material is that the resulting material contain thermodynamically unstable homopolar bonds of component A, meaning that the non-chalcogenide component A may form a bond with another component A in the glass, as initially formed, only if there is an insufficient amount of component B to satisfy the coordination number requirement for component A, which allows for the formation homopolar A-A bonds. The A-A homopolar bonds in such a glass material are thermodynamically unstable and will themselves break when the device is programmed and a conducting channel is formed in the glass backbone by the metal-chalcogenide layer when the chalcogenide component for the metal-chalcogenide layer bonds to the component A participating in the homopolar bonds. This property is dependent on the stoichiometry of the material $A_xB_{100-x}$ in that excess chalcogenide component B will inhibit the formation of homopolar A-A bonds.

What "excess" chalcogenide component B means in relation to the material $A_xB_{100-x}$ and its stoichiometry may be determined by whether the material exhibits the homopolar bonds or not. Raman spectroscopy can be a useful analytical tool for determining the presence of homopolar bonds when selecting a material $A_xB_{100-x}$ for the glass backbone in PCRAM devices. Raman Spectroscopy is based on the Raman effect, which is the inelastic scattering of photons by molecules. A plot of Raman intensity (counts) vs. Raman shift ($cm^{-1}$) is a Raman spectrum, which is the basis for FIGS. 1-3.

Figure 2:
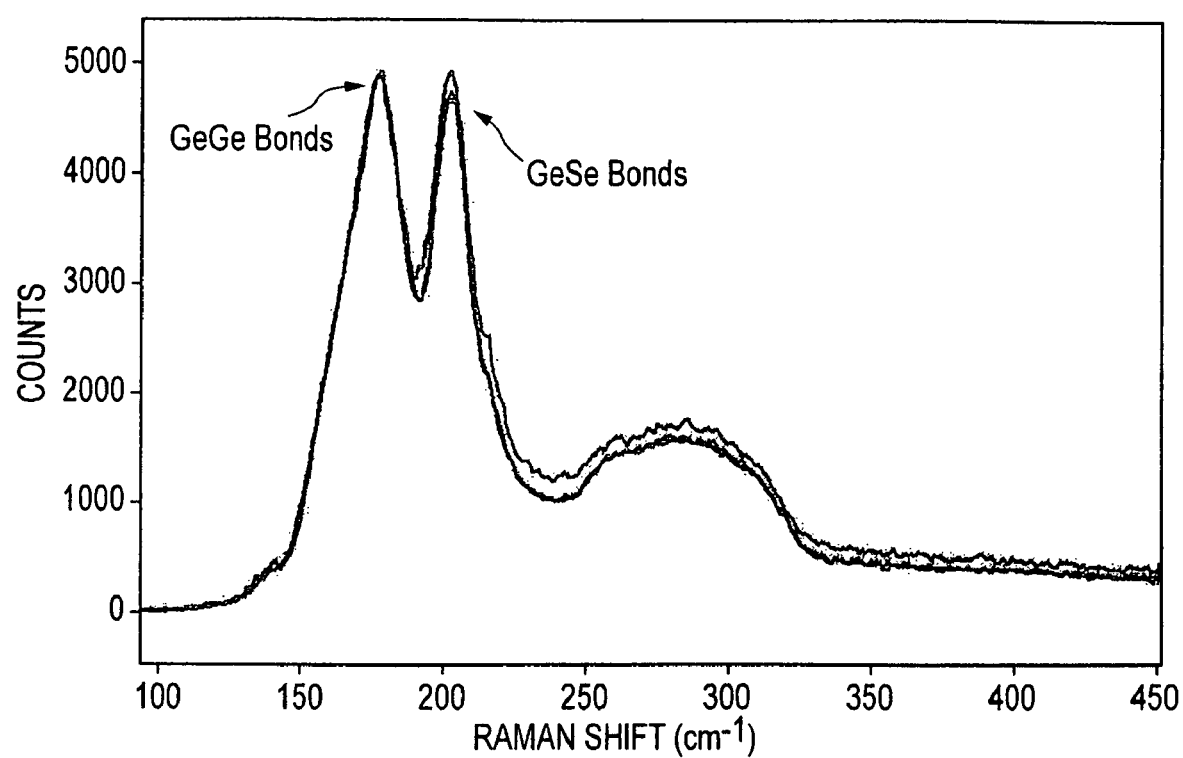
Figure 3:
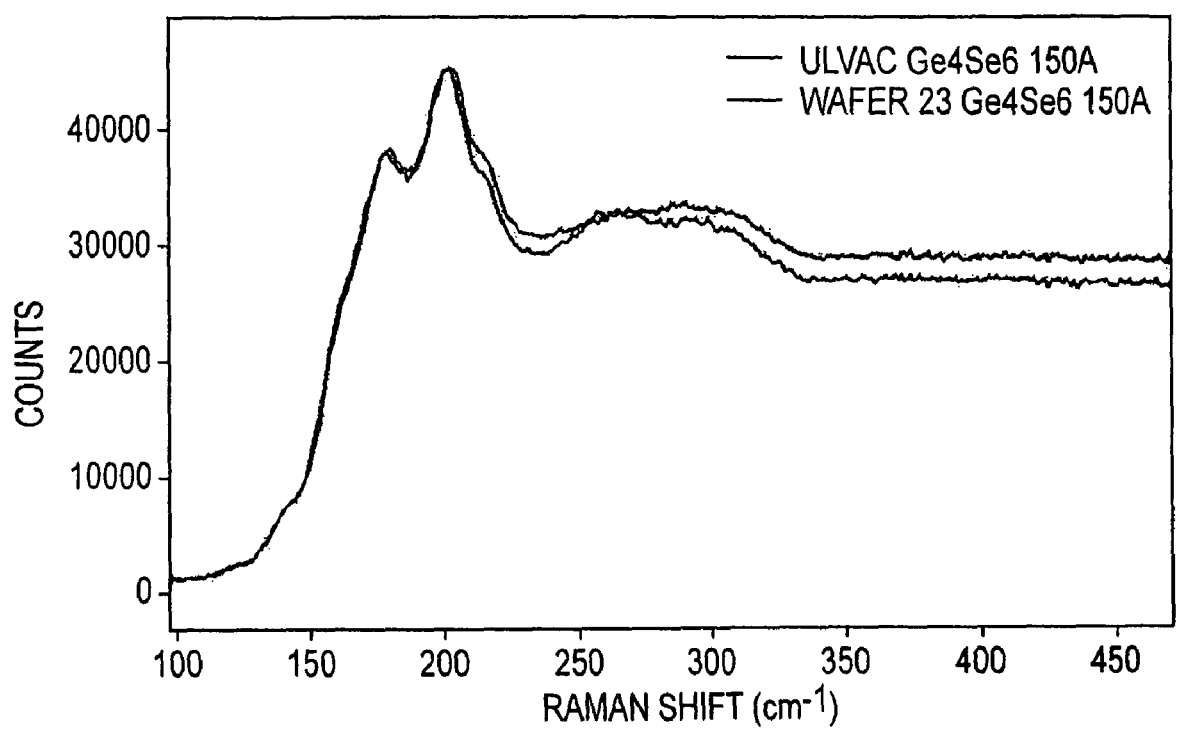

Referring now to FIG. 1, which is a Raman spectrum for bulk $Ge_{23}Se_{77}$ glass, it can be observed by the Raman Shift peaks at about 200 $cm^{-1}$ and at about 260 $cm^{-1}$ that the glass incorporates Ge—Se bonds and Se—Se (i.e., chalcogenide) bonds. This is an undesirable stoichiometry for the glass backbone since it lacks the homopolar Ge—Ge (i.e., non-chalcogenide) bonds desirable for switching in a device comprising a germanium selenide glass. Compare FIG. 1 to FIG. 2, the latter of which is a Raman spectrum for bulk $Ge_{40}Se_{60}$ glass, which shows a Raman Shift peak at about 175 $cm^{-1}$ that corresponds to Ge—Ge homopolar bonds and a peak at about 200 $cm^{-1}$ that corresponds to Ge—Se bonds. The prevalence of non-chalcogenide (i.e., Ge—Ge) homopolar bonds found in $Ge_{40}Se_{60}$ is a characteristic sought in materials for the glass backbone in PCRAM. This characteristic may also be seen in a thin film of $Ge_{40}Se_{60}$ using Raman spectra, as shown in FIG. 3. Similar comparisons of Raman spectra may be made for other materials $A_xB_{100-x}$ of varying stoichiometries to find spectra showing peaks demonstrating homopolar bonding of the non-chalcogenide component (i.e., A-A) in the material, which indicates that it has suitable properties for a glass backbone.

Taking the aforementioned desired characteristics into consideration, the method of detecting a suitable glass backbone may be performed by the following steps: (1) selection of a non-chalcogenide component A from Groups 3-15 that will exhibit homopolar bonds; (2) selection of a chalcogenide component B from Group 16 for which component A will have a bonding affinity, relative to the A-A homopolar bonds; (3) selection of a stoichiometry (i.e., x of $A_xB_{100-x}$) that will provide for a thermodynamically unstable glass and will allow the homopolar A-A bonds to form; and (4) confirmation that the glass $A_xB_{100-x}$, at the selected stoichiometry (i.e., x), will allow a conducting channel and a conductive pathway to form therein upon application of a conditioning voltage (when a metal-chalcogenide, e.g., $M_yB_{100-y}$, and metal ions are proximate the glass).

Using the above-discussed methodology for selecting glass backbone materials $A_xB_{100-x}$, at least three have been found suitable for use in PCRAM. These materials include arsenic selenide, represented by formula $As_{50}Se_{50}$, tin selenide, represented by formula $Sn_{50}Se_{50}$, and antimony selenide, represented by formula $Sb_xSe_{100-x}$. Although each of these exemplary materials include selenium for component B, other chalcogenides may be used as well.

Figure 4:
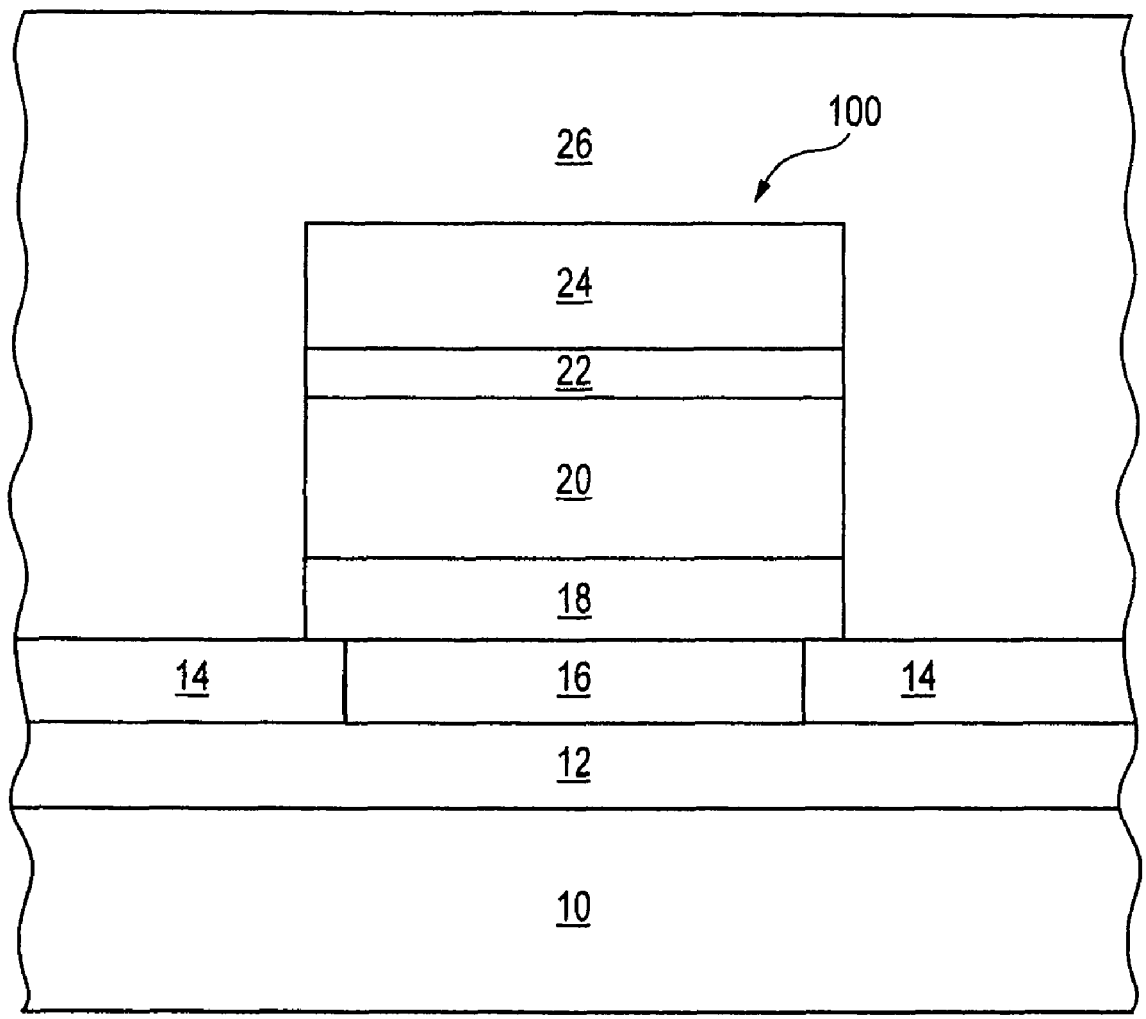
FIG. 4 shows an exemplary embodiment of a memory device in accordance with the invention.

The invention is now explained with reference to the other figures, which illustrate exemplary embodiments and throughout which like reference numbers indicate like features. FIG. 4 shows an exemplary embodiment of a memory device 100 constructed in accordance with the invention. The device 100 shown in FIG. 4 is supported by a substrate 10. Over the substrate 10, though not necessarily directly so, is a conductive address line 12, which serves as an interconnect for the device 100 shown and for a plurality of other similar devices of a portion of a memory array of which the shown device 100 is a part. It is possible to incorporate an optional insulating layer (not shown) between the substrate 10 and address line 12, and this may be preferred if the substrate 10 is semiconductor-based. The conductive address line 12 can be any material known in the art as being useful for providing an interconnect line, such as doped polysilicon, silver (Ag), gold (Au), copper (Cu), tungsten (W), nickel (Ni), aluminum (Al), platinum (Pt), titanium (Ti), and other materials.

Over the address line 12 is a first electrode 16, which can be defined within an insulating layer 14 (or may be a common blanket electrode layer; not shown), which is also over the address line 12. This electrode 16 can be any conductive material that will not migrate into chalcogenide glass, but is preferably tungsten (W). The insulating layer 14 should not allow the migration of metal ions and can be an insulating nitride, such as silicon nitride ($Si_3N_4$), a low dielectric constant material, an insulating glass, or an insulating polymer, but is not limited to such materials.

A memory element, i.e., the portion of the memory device 100 which stores information, is formed over the first electrode 16. In the embodiment shown in FIG. 4, a chalcogenide glass layer 18 is provided over the first electrode 16. The chalcogenide glass layer 18 has the stoichiometric formula $A_xB_{100-x}$, with A being a non-chalcogenide component and B being a chalcogenide component as discussed above. The material $A_xB_{100-x}$ may be many materials with the appropriate characteristics (e.g., homopolar bonds, homopolar bond strength, thermodynamic instability, etc.) and an appropriate stoichiometry, as discussed above, but may preferably be selected from $Sn_{50}Se_{50}$, $Sb_xSe_{100-x}$, and $As_{50}Se_{50}$, which have been found to be suitable by following the methodology discussed above. Arsenic selenide with equal amounts of arsenic and selenium for a formula $As_{50}Se_{50}$ is the preferred material for layer 18. The layer of chalcogenide glass 18 is preferably between about 100 Å and about 1000 Å thick, most preferably about 300 Å thick. Layer 18 need not be a single layer of glass, but may also be comprised of multiple sub-layers of chalcogenide glass having the same or different stoichiometries. This layer of chalcogenide glass 18 is in electrical contact with the underlying electrode 16.

Over the chalcogenide glass layer 18 is a layer of metal-chalcogenide 20, which may be any combination of metal component M, which may be selected from any metals, and chalcogenide component B, which is preferably the same chalcogenide as in the glass backbone layer 18, and may be represented by the formula $M_yB_{100-y}$. As with the glass backbone layer 18 material, other components may be added, but the metal-chalcogenide will be discussed as only two components M and B for simplicity sake. The metal-chalcogenide may be, for example, silver selenide ($Ag_ySe$, y being about 20) or tin selenide ($Sn_{10+/-y}Se$, where y is between about 10 and 0). The metal-chalcogenide layer 20 is preferably about 500 Å thick; however, its thickness depends, in part, on the thickness of the underlying chalcogenide glass layer 18. The ratio of the thickness of the metal-chalcogenide layer 20 to that of the underlying chalcogenide glass layer 18 should be between about 5:1 and about 1:1, more preferably about 2.5:1.

Still referring to FIG. 4, a metal layer 22 is provided over the metal-chalcogenide layer 20, with the metal of layer 22 preferably incorporating some silver. The metal layer 22 should be about 500 Å thick. The metal layer 22 assists the switching operation of the memory device 100. Over the metal layer 22 is a second electrode 24. The second electrode 24 can be made of the same material as the first electrode 16, but is not required to be so. In the exemplary embodiment shown in FIG. 4, the second electrode 24 is preferably tungsten (W). The device(s) 100 may be isolated by an insulating layer 26.

Figure 5:
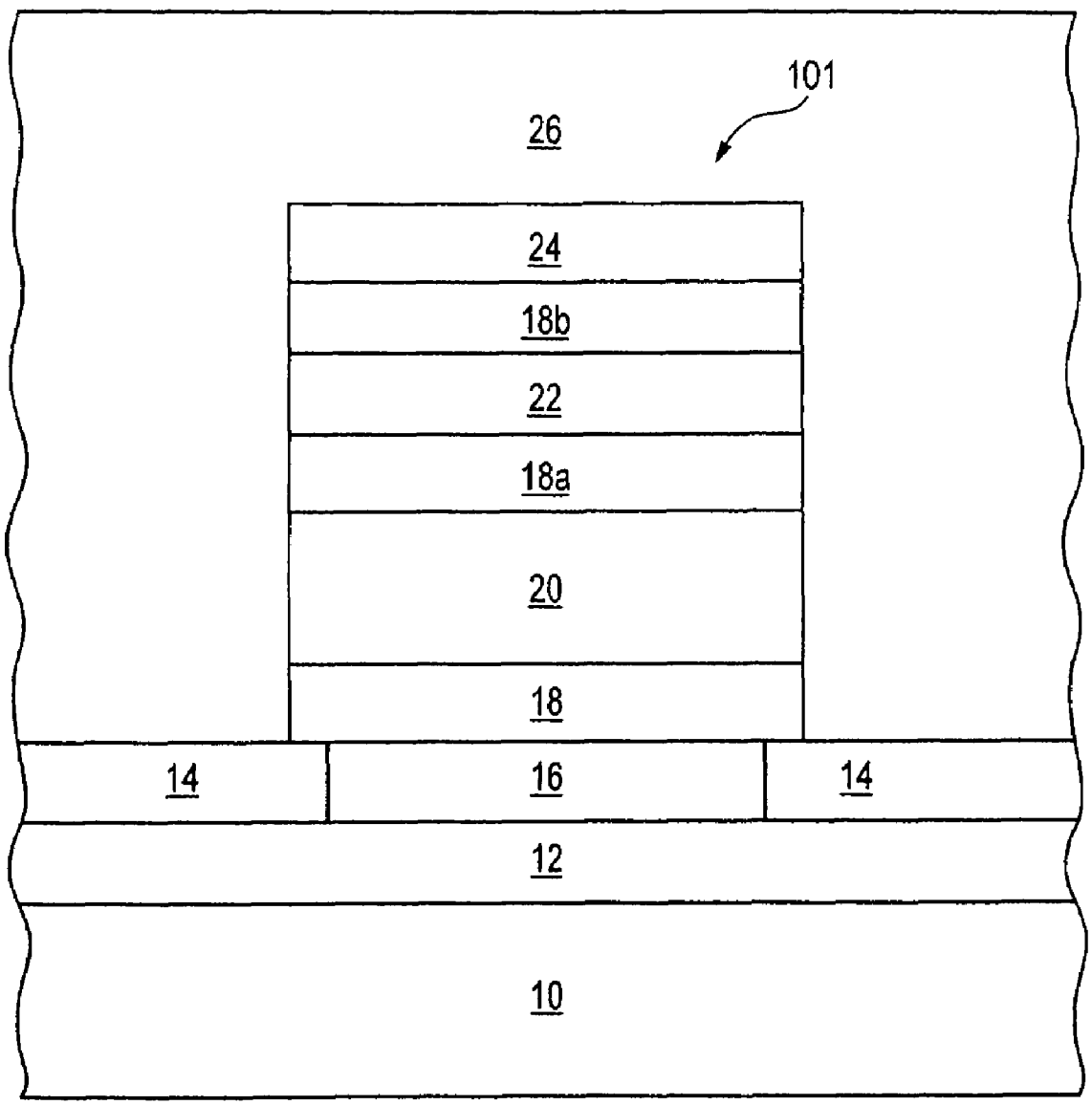
FIG. 5 shows an exemplary embodiment of a memory device in accordance with the invention.

FIG. 5 shows another exemplary embodiment of a memory device 101 constructed in accordance with the invention. Memory device 101 has many similarities to memory device 100 of FIG. 4 and layers designated with like reference numbers are preferably the same materials and have the same thicknesses as those described in relation to the embodiment shown in FIG. 4. For example, the first electrode 16 is preferably tungsten. The chalcogenide glass layer 18 material $A_xB_{100-x}$ is selected according to the methodology detailed above; it is preferably about 150 Å thick. As with device 100 of FIG. 4, the metal-chalcogenide layer 20 may be any combination $M_yB_{100-y}$; it is preferably about 470 Å thick. The metal layer 22 preferably contains some silver; it is preferably about 200 Å thick. The primary difference between device 100 and device 101 is the addition to device 101 of additional second and third chalcogenide layers 18a and 18b.

The second chalcogenide glass layer 18a is formed over the metal-chalcogenide layer 20 and is preferably about 150 Å thick. Over this second chalcogenide glass layer 18a is metal layer 22. Over the metal layer 22 is a third chalcogenide glass layer 18b, which is preferably about 100 Å thick. The third chalcogenide glass layer 18b provides an adhesion layer for subsequent electrode formation. As with layer 18 of FIG. 4, layers 18a and 18b are not necessarily a single layer, but may be comprised of multiple sub-layers. Additionally, the second and third chalcogenide layers 18a and 18b may be a different glass material from the first chalcogenide glass layer 18 or from each other. Glass materials that may be useful for this purpose include, but are not limited to, arsenic selenide ($As_xSe_{100-x}$), tin selenide ($Sn_xSe_{100-x}$), antimony selenide ($Sb_xSe_{100-x}$), and even germanium selenide ($Ge_xSe_{100-x}$), germanium sulfide ($Ge_xSe_{100-x}$), and combination of germanium (Ge), silver (Ag), and selenium (Se). The second electrode 24 is preferably tungsten (W), but may be other metals also.

The above-discussed embodiments are exemplary embodiments of the invention; however, other exemplary embodiments may be used which combine the first electrode layer 16 and address line layer 12. Another exemplary embodiment may use blanket layers (e.g., layers 16, 18, 20, and 22 of FIG.

4) of the memory cell body, where the memory cell is defined locally by the position of the second electrode 24 over the substrate 10. Another exemplary embodiment may form the memory device within a via. Additional layers, such as barrier layers or alloy-controlling layers, not specifically disclosed in the embodiments shown and discussed above, may be added to the devices in accordance with the invention without departing from the scope thereof.

FIGS. 6-11 illustrate a cross-sectional view of a wafer during the fabrication of a memory device 100 as shown by FIG. 1. Although the processing steps shown in FIGS. 6-11 most specifically refer to memory device 100 of FIG. 1, the methods and techniques discussed may also be used to fabricate memory devices of other embodiments (e.g., device 101 of FIG. 5) as would be understood by a person of ordinary skill in the art.

Figure 6:
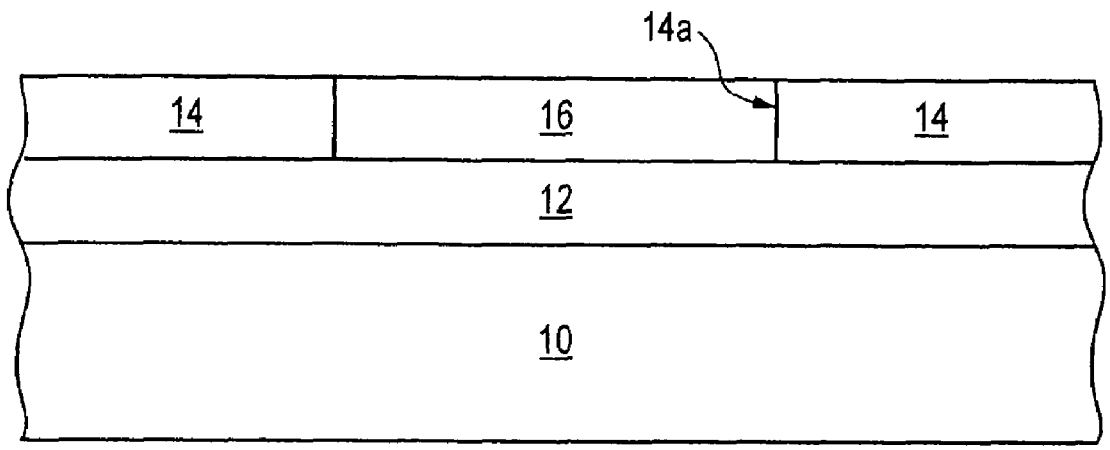
FIGS. 6-11 show a cross-section of a wafer at various stages during the fabrication of a device in accordance with an embodiment of the invention.

As shown by FIG. 6, a substrate 10 is provided. As indicated above, the substrate 10 can be semiconductor-based or another material useful as a supporting structure as is known in the art. If desired, an optional insulating layer (not shown) may be formed over the substrate 10; the optional insulating layer may be silicon nitride or other insulating materials used in the art. Over the substrate 10 (or optional insulating layer, if desired), a conductive address line 12 is formed by depositing a conductive material, such as doped polysilicon, aluminum, platinum, silver, gold, nickel, but preferably tungsten, patterning one or more conductive lines, for instance with photolithographic techniques, and etching to define the address line 12. The conductive material may be deposited by any technique known in the art, such as sputtering, chemical vapor deposition, plasma enhanced chemical vapor deposition, evaporation, or plating.

Still referring to FIG. 6, over the address line 12 is formed an insulating layer 14. This layer 14 can be silicon nitride, a low dielectric constant material, or many other insulators known in the art that do not allow metal (e.g., silver, copper, or other metal) ion migration, and may be deposited by any method known in the art. An opening 14a in the insulating layer is made, for example, by photolithographic and etching techniques, thereby exposing a portion of the underlying address line 12. Over the insulating layer 14, within the opening 14a, and over the address line 12 is formed a conductive material, preferably tungsten (W). A chemical mechanical polishing step may then be utilized to remove the conductive material from over the insulating layer 14, to leave it as a first electrode 16 over the address line 12, and planarize the wafer.

Figure 7:
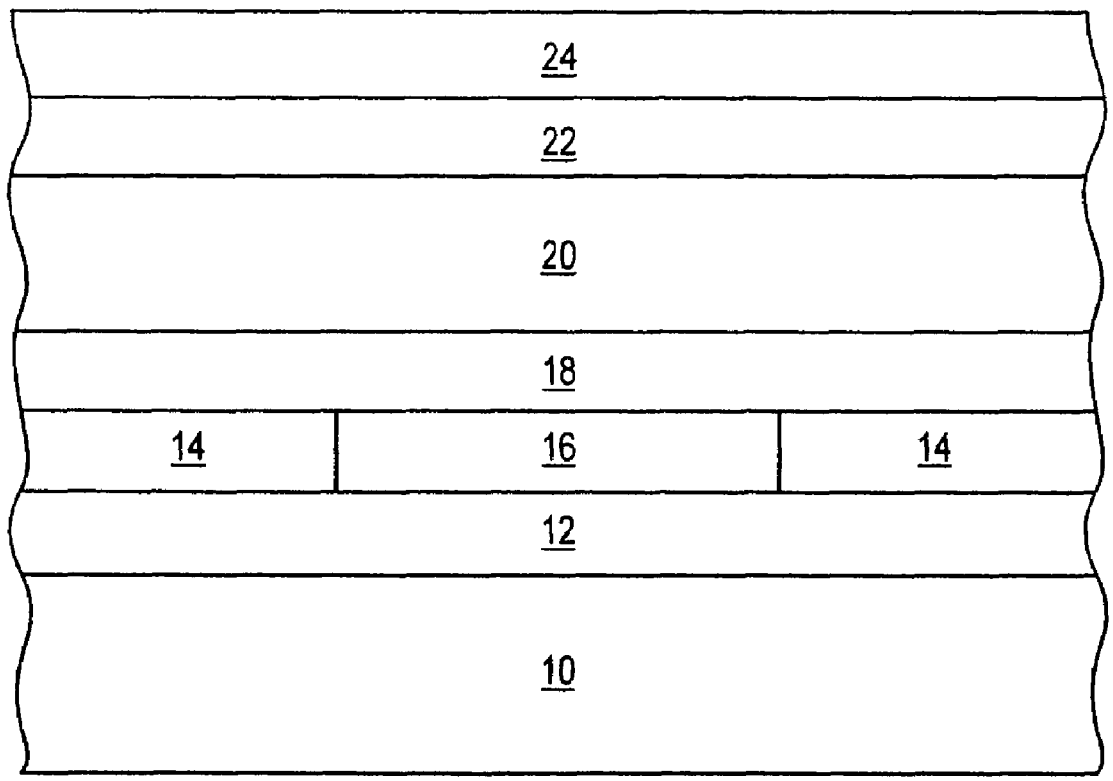

FIG. 7 shows the cross-section of the wafer of FIG. 6 at a subsequent stage of processing. A series of layers making up the memory device 100 (FIG. 4) are blanket-deposited over the wafer. A chalcogenide glass layer 18 is formed to a preferred thickness of about 300 Å over the first electrode 16 and insulating layer 14. The chalcogenide glass layer 18 is preferably selected from $As_{50}Se_{50}$, $Sn_{50}Se_{50}$, and $Sb_xSe_{100-x}$, but as described above, may be selected from many materials $A_xB_{100-x}$ with appropriate characteristics and of an appropriate stoichiometry for memory function. The steps in selecting a chalcogenide glass layer 18 material are: (1) selection of a non-chalcogenide component A from Groups 3-15 that will exhibit homopolar bonds; (2) selection of a chalcogenide component B from Group 16 for which component A will have a bonding affinity, relative to the A-A homopolar bonds; (3) selection of a stoichiometry (i.e., x of $A_xB_{100-x}$) that will provide for thermodynamically unstable homopolar A-A bonds; and (4) confirmation that the glass $A_xB_{100-x}$, at the selected stoichiometry (i.e., x), will allow a conducting channel and a conductive pathway to form therein upon application of a conditioning voltage when a metal-chalcogenide layer 20 is proximate the glass layer 18. Once the materials are selected, deposition of the chalcogenide glass layer 18 may be accomplished by any suitable method, such as evaporative techniques or chemical vapor deposition; however, the preferred technique utilizes either sputtering or co-sputtering.

Still referring to FIG. 7, a metal-chalcogenide layer 20, e.g., $M_yB_{100-y}$, is formed over the chalcogenide glass layer 18. Physical vapor deposition, chemical vapor deposition, co-evaporation, sputtering, or other techniques known in the art may be used to deposit layer 20 to a preferred thickness of about 500 Å. Again, the thickness of layer 20 is selected based, in part, on the thickness of layer 18 and the ratio of the thickness of the metal-chalcogenide layer 20 to that of the underlying chalcogenide glass layer 18 is preferably from about 5:1 to about 1:1, more preferably about 2.5:1. It should be noted that, as the processing steps outlined in relation to FIGS. 6-11 may be adapted for the formation of other devices in accordance the invention, e.g., the layers may remain in blanket-deposited form, a barrier or alloy-control layer may be formed adjacent to the metal-chalcogenide layer 20, on either side thereof, or the layers may be formed within a via.

Still referring to FIG. 7, a metal layer 22 is formed over the metal-chalcogenide layer 20. The metal layer 22 preferably incorporates at least some silver (Ag), but may be other metals as well, such as copper (Cu) or a transition metal, and is formed to a preferred thickness of about 300 Å. The metal layer 22 may be deposited by any technique known in the art.

Still referring to FIG. 7, over the metal layer 22, a conductive material is deposited for a second electrode 24. Again, this conductive material may be any material suitable for a conductive electrode, but is preferably tungsten; however, other materials may be used such as titanium nitride or tantalum, for example.

Figure 8:
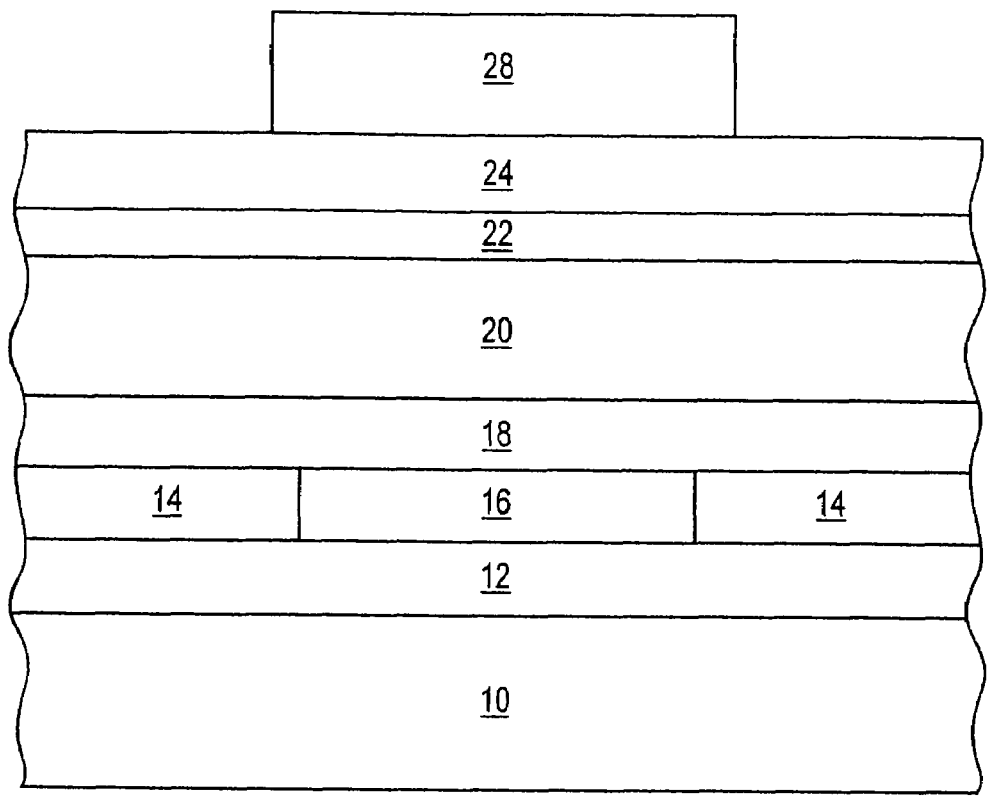
Figure 9:
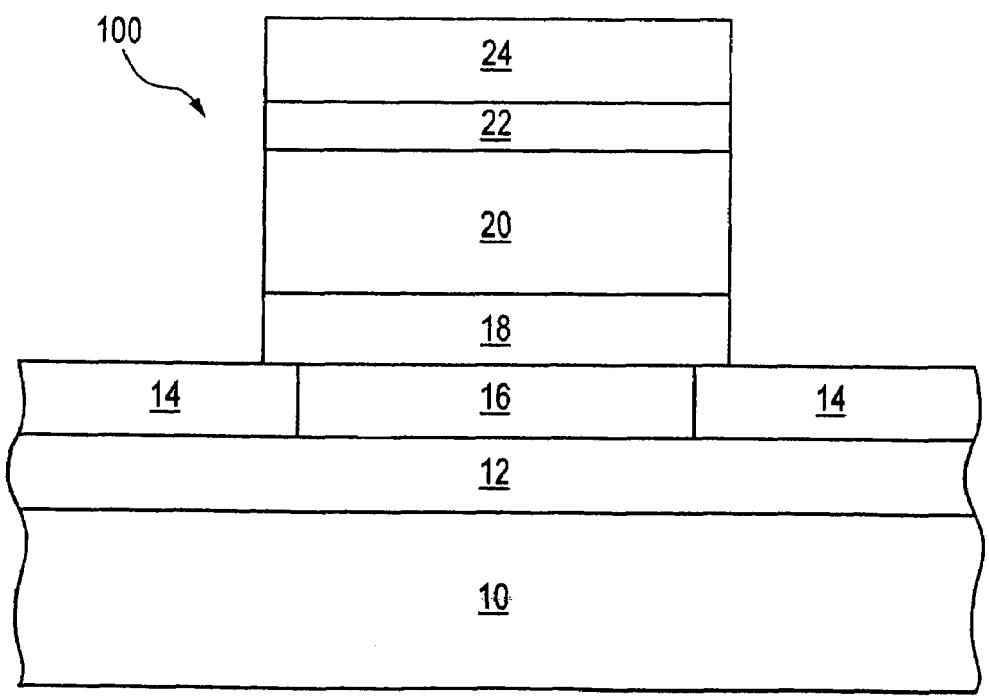
Figure 10:
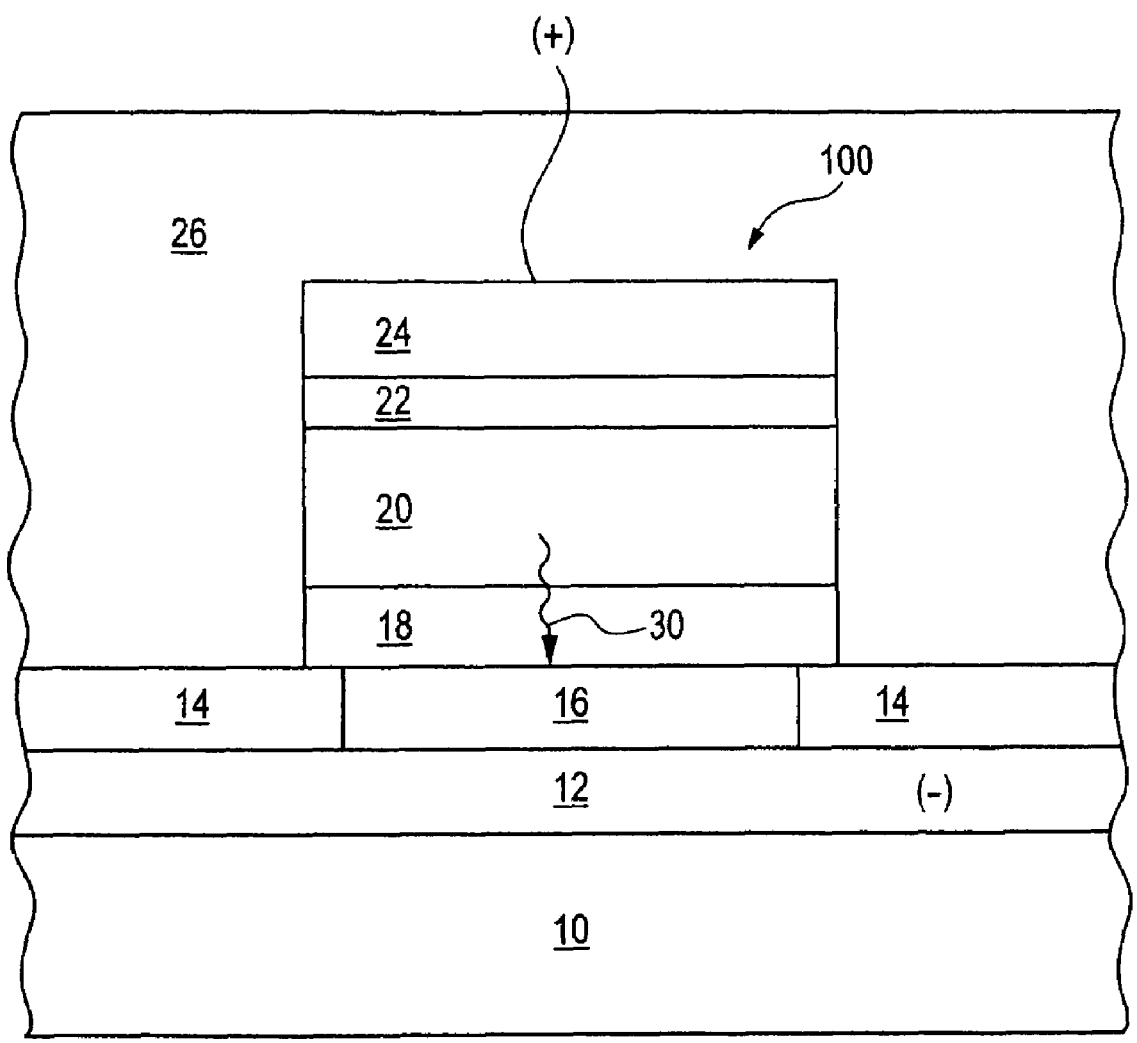
Figure 11:
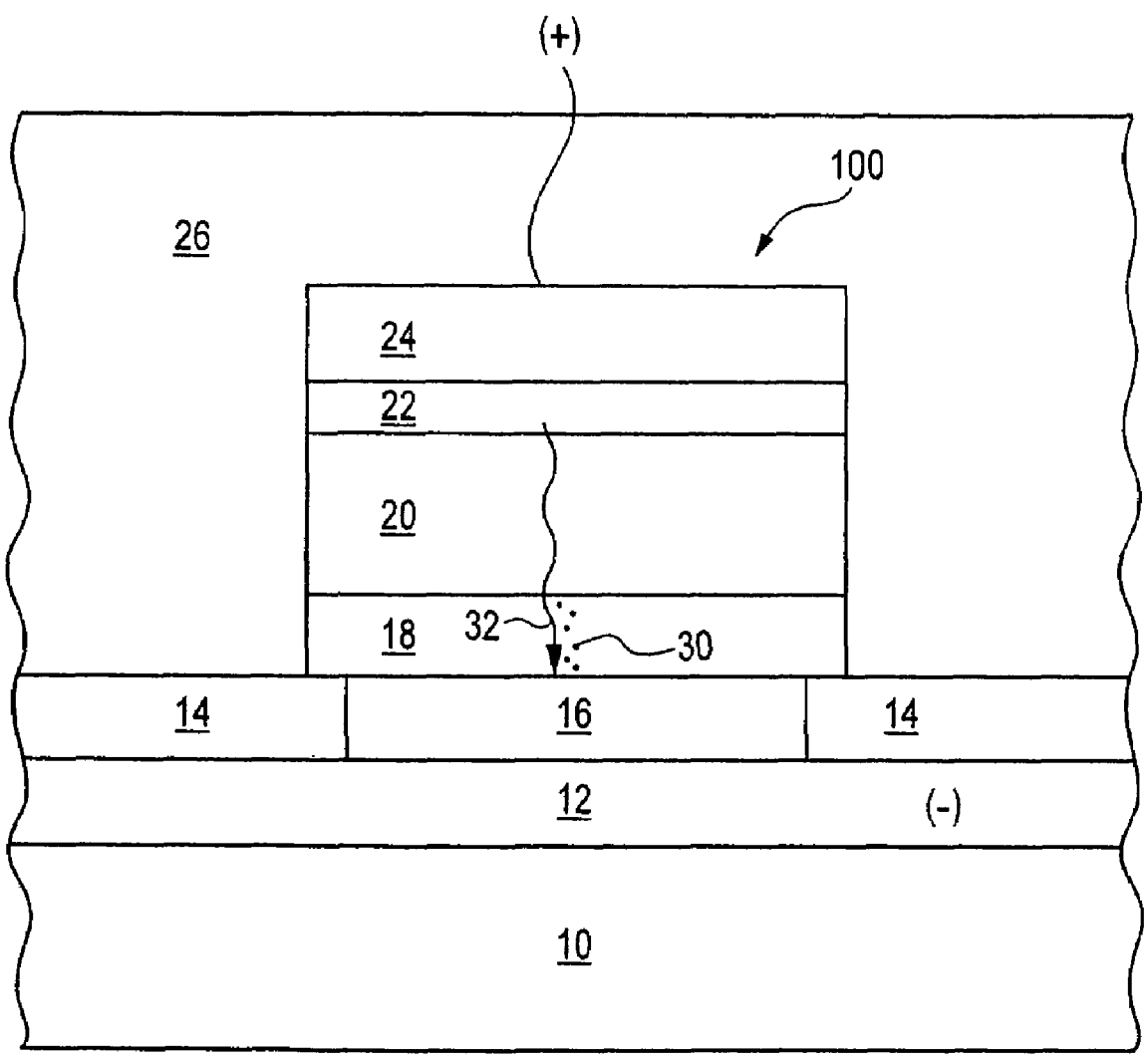

Now referring to FIG. 8, a layer of photoresist 28 is deposited over the top electrode 24 layer, masked and patterned to define the stacks for the memory device 100, which is but one of a plurality of like memory devices of a memory array. An etching step is used to remove portions of layers 18, 20, 22, and 24, with the insulating layer 14 used as an etch stop, leaving stacks as shown in FIG. 9. The photoresist 30 is removed, leaving a substantially complete memory device 100, as shown by FIG. 9. An insulating layer 26 may be formed over the device 100 to achieve a structure as shown by FIGS. 4, 10, and 11. This isolation step can be followed by the forming of connections (not shown) to other circuitry of the integrated circuit (e.g., logic circuitry, sense amplifiers, etc.) of which the memory device 100 is a part, as is known in the art.

As shown in FIG. 10, a conditioning step is performed by applying a voltage pulse of about 0.20 V to incorporate material from the metal-chalcogenide layer 20 into the chalcogenide glass layer 18 to form a conducting channel 30 in the chalcogenide glass layer 18. The conducting channel 30 will support a conductive pathway 32, as shown in FIG. 11, upon application of a programming pulse of about 0.17 V during operation of the memory device 100.

The embodiments described above refer to the formation of only a few possible resistance variable memory device structures (e.g., PCRAM) in accordance with the invention, which may be part of a memory array. It must be understood, however, that the invention contemplates the formation of other memory structures within the spirit of the invention, which can be fabricated as a memory array and operated with memory element access circuits.

Figure 12:
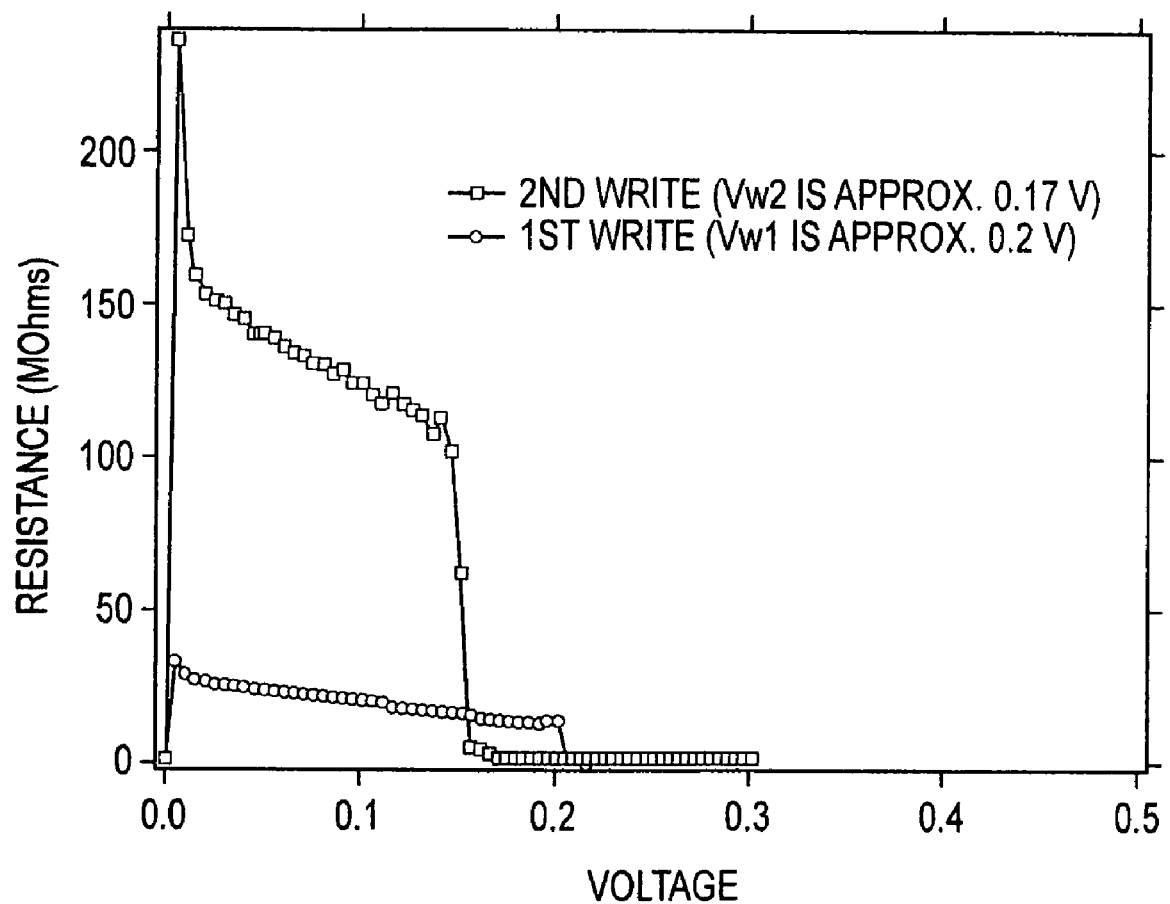
FIG. 12 shows a resistance-voltage curve of a first (conditioning) write and second (programming) write for a 0.13 μm device in accordance with the invention.

FIG. 12 shows a resistance-voltage curve of a first write, which corresponds to a conditioning voltage, and a second write, which corresponds to a programming voltage, for a 0.13 Mm device such as device 100 or 101 shown in FIGS. 4 and 5, respectively. The device represented by the curve of FIG. 12 has an $As_{50}Se_{50}$ chalcogenide glass layer 18 (See FIGS. 4 and 5). FIG. 12 shows that the first write is at a slightly higher potential than the second write (i.e., about 0.2 V. compared to about 0.17 V, respectively). This is because the first write conditions the device in accordance with the processing shown at FIG. 10 by forming a conducting channel 30, which remains intact after this first write. The second write requires less voltage because the stable conducting channel 30 is already formed by the conditioning write and the conductive pathway 32 is formed more easily. Application of these write voltages programs the device to a non-volatile higher conductivity, lower resistivity, memory state. These observed programming parameters utilizing a chalcogenide glass layer 18 selected in accordance with the invention show that the tested devices work as well as when $Ge_{40}Se_{60}$ is used as the glass backbone.

The erase potential for a device having an $As_{50}Se_{50}$ chalcogenide glass layer (e.g., layer 18) is also similar to a device having $Ge_{40}Se_{60}$ glass. This erase voltage curve is not shown in FIG. 12; however, the erase potential is about −0.06 V, which returns the device to a non-volatile higher resistance, lower conductivity memory state.

Figure 13:
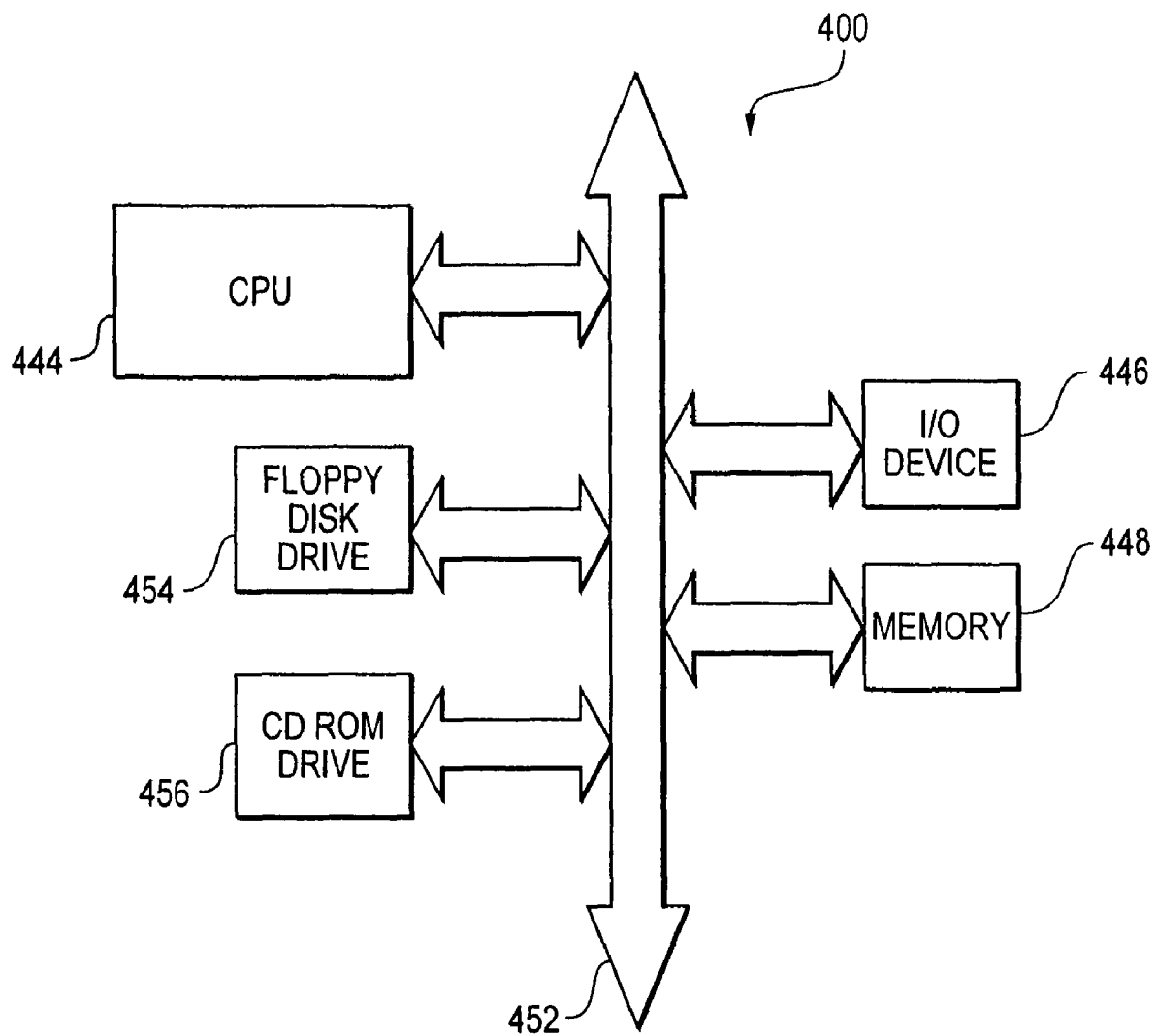
FIG. 13 shows an exemplary processor-based system incorporating memory devices in accordance with the invention.

FIG. 13 illustrates a typical processor system 400 which includes a memory circuit 448, e.g., a PCRAM device, which employs resistance variable memory devices (e.g., devices 100 and 101) fabricated in accordance with an embodiment the invention. A processor system, such as a computer system, generally comprises a central processing unit (CPU) 444, such as a microprocessor, a digital signal processor, or other programmable digital logic devices, which communicates with an input/output (I/O) device 446 over a bus 452. The memory circuit 448 communicates with the CPU 444 over bus 452 typically through a memory controller.

In the case of a computer system, the processor system may include peripheral devices such as a floppy disk drive 454 and a compact disc (CD) ROM drive 456, which also communicate with CPU 444 over the bus 452. Memory circuit 448 is preferably constructed as an integrated circuit, which includes one or more resistance variable memory devices, e.g., device 100. If desired, the memory circuit 448 may be combined with the processor, for example CPU 444, in a single integrated circuit.

The above description and drawings should only be considered illustrative of exemplary embodiments that achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of forming a memory cell comprising a chalcogenide glass with the formula $A_xB_{100-x}$, the method comprising:
   providing component A to be either Sn or Sb;
   providing component B to be a material from Group 16 of the periodic table;
   providing a metal-chalcogenide material $M_yB_{100-y}$ proximate the chalcogenide glass; and
   applying a conditioning voltage that at least partially replaces homopolar bonds of A-A in the chalcogenide glass with A-B bonds to form a conducting channel.

2. The method of claim 1, further comprising providing the metal-chalcogenide material between the chalcogenide glass and the second electrode.

3. The method of claim 1, wherein component B is selenide and the metal-chalcogenide material comprises one of tin selenide and silver selenide.

4. A method of forming a processor system, comprising:
   providing a processor; and
   providing a memory device, the memory device comprising a first electrode, a second electrode, a metal-chalcogenide material between the first and second electrodes, and a chalcogenide glass with formula $A_xB_{100-x}$ between the first and second electrodes, wherein the chalcogenide glass is formed by:
   providing the component A to be either Sn or Sb so that the chalcogenide glass will comprise homopolar bonded component A;
   providing the component B from Group 16 of the periodic table so that component A has a bonding affinity for component B relative to the component A homopolar bonds; and
   applying a conditioning voltage that at least partially replaces A-A homopolar bonds in the chalcogenide glass with bonds between component A of the chalcogenide glass and a component of the metal-chalcogenide material, forming a conducting channel in the chalcogenide glass.

5. The method of claim 4, wherein the homopolar bonds are broken and bonds formed between the components A and B when the conducting channel is formed within the chalcogenide glass.

6. The method of claim 4, wherein the metal-chalcogenide material comprises component B.

7. The method of claim 4, wherein the metal-chalcogenide material is provided as a layer between the chalcogenide glass and the second electrode.

8. The method of claim 7, further comprising providing a metal between the metal-chalcogenide material and the second electrode.

9. The method of claim 8, further comprising providing a second chalcogenide glass between the metal-chalcogenide material and metal and providing a third chalcogenide glass between the metal and the second electrode.

10. A method of forming a memory device, comprising:
    providing a first electrode and a second electrode;
    providing metal-chalcogenide material between the first and second electrodes;
    providing chalcogenide glass between the first and second electrodes, the chalcogenide glass comprising a material with formula $A_xB_{100-x}$;
    providing component A of the chalcogenide glass to be either Sn or Sb;
    providing component B of the chalcogenide glass from Group 16 of the periodic table so that component A has a bonding affinity for component B relative to homopolar bonds of component A; and
    applying a conditioning voltage that forms bonds between component A of the chalcogenide glass and a component of the metal chalcogenide material to form a conducting channel in the chalcogenide glass.

11. The method of claim 10, wherein the metal-chalcogenide material is provided between the chalcogenide glass and the second electrode.

12. The method of claim 10, wherein the metal-chalcogenide material comprises component B.

13. The method of claim 12, wherein the homopolar bonds of component A are broken and bonds are formed between components A and B when the conducting channel is formed within the chalcogenide glass.

14. The method of claim 10, wherein the metal-chalcogenide material comprises one of tin selenide and silver selenide.

15. The method of claim 14, further comprising providing a metal between the metal-chalcogenide material and the second electrode.

16. The method of claim 15, further comprising providing a second chalcogenide glass between the metal-chalcogenide material and the metal.

17. The method of claim 16, further comprising providing a third chalcogenide glass between the metal and the second electrode.

* * * * *

UNITED STATES PATENT AND TRADEMARK OFFICE
CERTIFICATE OF CORRECTION

PATENT NO. : 7,785,976 B2  Page 1 of 1
APPLICATION NO. : 12/073055
DATED : August 31, 2010
INVENTOR(S) : Kristy A. Campbell It is certified that error appears in the above-identified patent and that said Letters Patent is hereby corrected as shown below:

In column 1, line 8, delete "entity" and insert -- entirety --, therefor.

Signed and Sealed this

Thirtieth Day of November, 2010

David J. Kappos
*Director of the United States Patent and Trademark Office*